(12) United States Patent
Xu et al.

(10) Patent No.: US 11,579,875 B2
(45) Date of Patent: Feb. 14, 2023

(54) COMPUTING CHIP, HASHRATE BOARD AND DATA PROCESSING APPARATUS

(71) Applicant: SHENZHEN MICROBT ELECTRONICS TECHNOLOGY CO., LTD., Guangdong (CN)

(72) Inventors: Chao Xu, Guangdong (CN); Zhijun Fan, Guangdong (CN); Ke Xue, Guangdong (CN); Zuoxing Yang, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/633,084

(22) PCT Filed: Jun. 8, 2021

(86) PCT No.: PCT/CN2021/098781
§ 371 (c)(1),
(2) Date: Feb. 4, 2022

(87) PCT Pub. No.: WO2022/088683
PCT Pub. Date: May 5, 2022

(65) Prior Publication Data
US 2022/0276868 A1    Sep. 1, 2022

(30) Foreign Application Priority Data
Oct. 30, 2020 (CN) .......................... 202011194830.4

(51) Int. Cl.
*G06F 9/30* (2018.01)
*G06F 7/57* (2006.01)

(52) U.S. Cl.
CPC ............ *G06F 9/30079* (2013.01); *G06F 7/57* (2013.01); *G06F 9/30029* (2013.01); *G06F 9/30105* (2013.01)

(58) Field of Classification Search
CPC .... G06F 9/30079; G06F 7/57; G06F 9/30029; G06F 9/30105; G06F 9/30; G06F 9/38
See application file for complete search history.

(56) References Cited

U.S. PATENT DOCUMENTS 4,249,193 A * 2/1981 Balyoz .................. H01L 23/528
257/923
9,432,298 B1 * 8/2016 Smith ...................... H04L 47/34
(Continued)

FOREIGN PATENT DOCUMENTS

| CN | 102185587 A | 9/2011 |
| CN | 111459458 A | 7/2020 |

(Continued)

OTHER PUBLICATIONS

Office Action dated Apr. 29, 2022 in Taiwanese Application No. 110120773.
(Continued)

*Primary Examiner* — Farley Abad
(74) *Attorney, Agent, or Firm* — Venable LLP

(57) ABSTRACT

This disclosure relates to a computing chip, a hashrate board, and a data processing apparatus. The computing chip includes a plurality of operation stages arranged in a pipeline configuration. Each operation stage includes: a first combinational logic circuit occupying a plurality of first cell points adjacent to each other, at least a portion of the first cell points being located in a first incomplete column; one or more second combinational logic circuits each occupying one or more second cell points, at least a portion of the second cell points being located in a second incomplete column; and a plurality of registers each occupying a plurality of third cell (Continued)

points, at least a portion of the third cell points being located in the first incomplete column or the second incomplete column. The first cell points, the second cell points, and third cell points occupy equal areas on the computing chip.

17 Claims, 3 Drawing Sheets

(56) References Cited

U.S. PATENT DOCUMENTS

| | | | |
|---|---|---|---|
| 2011/0140940 A1 | 6/2011 | Cho et al. | |
| 2014/0103959 A1* | 4/2014 | Andreev | G06F 30/327 716/105 |
| 2016/0125040 A1 | 5/2016 | Kheterpal et al. | |

FOREIGN PATENT DOCUMENTS

| | | |
|---|---|---|
| CN | 210958338 U | 7/2020 |
| CN | 111562808 A | 8/2020 |
| CN | 111600699 A | 8/2020 |
| CN | 213042269 U | 4/2021 |
| TW | 201627889 A | 8/2016 |

OTHER PUBLICATIONS

International Search Report and Written Opinion dated Sep. 9, 2021 in International Application No. PCT/CN2021/098781.

* cited by examiner

COMPUTING CHIP, HASHRATE BOARD AND DATA PROCESSING APPARATUS

CROSS-REFERENCE TO RELATED APPLICATIONS

The present application is a national stage entry of International Application No. PCT/CN2021/098781, filed on Jun. 8, 2021, which claims priority to Chinese patent application No. 202011194830.4, filed on Oct. 30, 2020, the contents of which are hereby incorporated by reference in their entireties.

TECHNICAL FIELD

The present disclosure relates to the field of chip technologies, and particularly, to a computing chip, a hashrate board, and a data processing apparatus.

BACKGROUND

In a common data processing apparatus, a computing chip can be designed based on a pipeline configuration according to characteristics of an algorithm. Specifically, operation logic can be divided into several operation stages arranged in the pipeline configuration, wherein each operation stage can have a similar function design and operation structure.

Currently, various circuits or devices in the operation stage are typically designed to occupy a rectangular area in the computing chip, the rectangular area being composed of a number of rows and columns of cell points, wherein a cell point refers to a minimum unit in the chip design. However, due to characteristics of the circuit or device itself, space in some rectangular areas may not be fully utilized, i.e., some cell points may not be used for any circuit or device. Therefore, the layout of the existing computing chip is not compact enough, and as a result, the computing chip or another apparatus containing the computing chip occupies more space.

SUMMARY

An objective of the present disclosure is to provide a computing chip, a hashrate board, and a data processing apparatus.

According to a first aspect of the present disclosure, there is provided a computing chip including a plurality of operation stages arranged in a pipeline configuration, each operation stage including:

a first combinational logic circuit occupying a plurality of first cell points adjacent to each other, at least a portion of the first cell points being located in a first incomplete column in which the number of first cell points is less than a first preset number N1, wherein the first preset number N1 is a maximum number of cell points that can be accommodated by each column in the computing chip;

one or more second combinational logic circuits each occupying one or more second cell points, at least a portion of the second cell points being located in a second incomplete column in which the number of second cell points is less than or equal to a second preset number N2, wherein N2=N1/2; and a plurality of registers each occupying a plurality of third cell points, at least a portion of the third cell points being located in the first incomplete column or the second incomplete column; wherein the first cell points, the second cell points, and the third cell points occupy equal areas on the computing chip.

In some embodiments, at least another portion of the first cell points are located in a first complete column in which the number of first cell points is equal to the first preset number N1.

In some embodiments, in the first incomplete column, the number of first cell points is greater than or equal to the second preset number N2.

In some embodiments, in a same first combinational logic circuit, the number of first incomplete columns is equal to one.

In some embodiments, in a data flow direction in the computing chip, an input of the first combinational logic circuit is directly connected to a register and an output of the first combinational logic circuit is directly connected to a register.

In some embodiments, in a data flow direction in the computing chip, an input of the first combinational logic circuit is directly connected to the second combinational logic circuit, or an output of the first combinational logic circuit is directly connected to the second combinational logic circuit.

In some embodiments, the first combinational logic circuit includes an adder.

In some embodiments, when the number of second cell points occupied by the same second combinational logic circuit is greater than the second preset number N2, one or more second cell points whose count is more than the second preset number N2 are located on one or two middle rows of the computing chip.

In some embodiments, at least one second combinational logic circuit occupies a third preset number, N3, of second cell points located in a same second complete column, wherein N3=N1−2.

In some embodiments, in a data flow direction in the computing chip, an input of a leading second combinational logic circuit is directly connected to a register, and an output of a last second combinational logic circuit is directly connected to a register.

In some embodiments, in a data flow direction in the computing chip, an input of at least one second combinational logic circuit is directly connected to the first combinational logic circuit, or an output of at least one second combinational logic circuit is directly connected to the first combinational logic circuit.

In some embodiments, each register includes a low-bit sub-register and a high-bit sub-register having an equal fourth number of bits N0, wherein N0=(N1−2)/2.

In some embodiments, the low-bit sub-register includes N0 first storage units and one first clock unit; the high-bit sub-register includes N0 second storage units and one second clock unit; wherein the first clock unit and the second clock unit are connected to a same clock signal source together.

In some embodiments, the first clock unit and the second clock unit are located on two middle rows of the computing chip.

In some embodiments, a first number of bits of the first combinational logic circuit is 2*N0 or 2*N0−1; a second number of bits of the second combinational logic circuit is less than or equal to 2*N0; and a third number of bits of a register is 2*N0.

According to a second aspect of the present disclosure, there is also provided a hashrate board including one or more computing chips as described above.

According to a third aspect of the present disclosure, there is also provided a data processing apparatus including one or more hashrate boards as described above.

Other features and advantages of the present disclosure will become more apparent from the following detailed description of exemplary embodiments thereof, which proceeds with reference to the accompanying drawings.

BRIEF DESCRIPTION OF THE DRAWINGS

The accompanying drawings, which constitute a part of this specification, illustrate embodiments of the present disclosure and together with the specification, serve to explain principles of the present disclosure.

The present disclosure can be more clearly understood from the following detailed description taken with reference to the accompanying drawings, in which.

Figure 1:
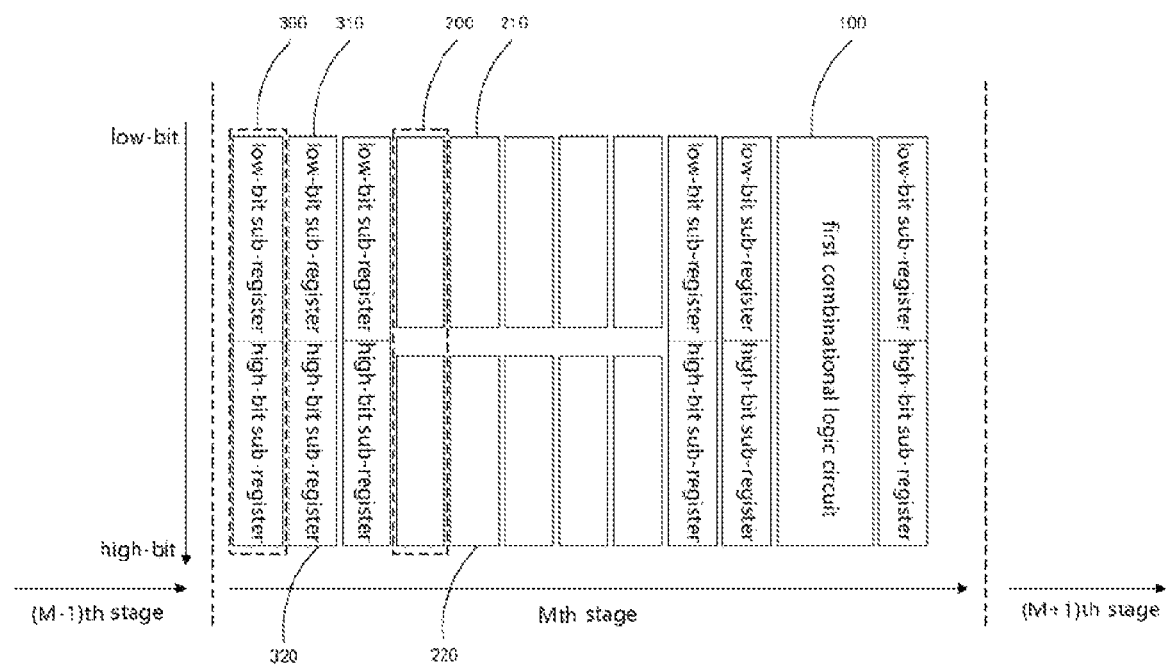
FIG. 1 is a schematic structural diagram of a computing chip.

Note that in the embodiments described below, a same reference numeral is shared among different drawings to denote a same portion or portion having a same function in some cases, and a duplicated description thereof is omitted. In some cases, similar reference numbers and letters are used to denote similar items, and thus, once a certain item is defined in one drawing, it does not need to be further discussed in subsequent drawings.

For ease of understanding, positions, dimensions, ranges, and the like of structures shown in the drawings and the like sometimes do not indicate actual positions, dimensions, ranges, and the like. Therefore, the present disclosure is not limited to the positions, dimensions, ranges, and the like disclosed in the drawings and the like.

DETAILED DESCRIPTION

Various exemplary embodiments of the present disclosure will be described in detail below with reference to the accompanying drawings. It should be noted that: relative arrangements, numerical expressions and numerical values of components and steps set forth in these embodiments do not limit the scope of the present disclosure unless otherwise specified.

The following description of at least one exemplary embodiment is merely illustrative in nature and is in no way intended to limit the present disclosure, and its applications or uses. That is, structures and methods herein are shown by way of examples to illustrate different embodiments of the structures and methods of the present disclosure. Those skilled in the art should appreciate that these examples indicate implementations of the present disclosure only in an illustrative manner, not in an exhaustive manner. Further, the drawings are not necessarily drawn to scale, some features may be enlarged to show details of some particular components.

Techniques, methods, and apparatuses known to one of ordinary skill in the related art may not be discussed in detail but are intended to be part of the specification where appropriate.

In all examples shown and discussed herein, any specific value should be construed as merely exemplary and not restrictive. Thus, other examples of the exemplary embodiments can have different values.

According to a first aspect of the present disclosure, a computing chip is provided, which is made more compact for less occupied space by changing layout of circuits or devices therein.

As shown in FIGS. 1 to 5, the computing chip can include a plurality of operation stages arranged in a pipeline configuration (the figures show an (M−1)th stage, an Mth stage, and an (M+1)th stage, and specifically show a schematic structure of the Mth stage). In the computing chip of FIGS. 1 to 5, data flows generally in a left-to-right direction, that is, the data output from the (M−1)th stage flows to the Mth stage, and after being processed by the Mth stage, the data continues to flow to the (M+1)th stage to be processed. In the computing chip, different operation stages can have similar function designs and operation structures, thereby implementing a corresponding algorithm.

As shown in FIGS. 1 to 5, each operation stage in the computing chip can include a sequential logic circuit and a combinational logic circuit. In the sequential logic circuit, an output at an arbitrary moment is dependent not only on an input signal at the current moment, but also on an original state of the sequential logic circuit; and in the combinational logic circuit, an output at arbitrary moment is dependent only on an input at the moment, independent of an original state of the combinational logic circuit. The numbers of bits of the sequential logic circuit and the combinational logic circuit correspond to each other to facilitate algorithm execution. For example, the number of bits of the combinational logic circuit can be less than or equal to that of the sequential logic circuit.

As described above, in the computing chip, a minimum unit of chip design can be referred to as a cell point. It can be appreciated that each sequential logic circuit or combinational logic circuit can occupy an integer number of cell points in the computing chip. Further, in some computing chips, for convenience of arrangement, several cell points arranged in a rectangular array are allocated to each sequential logic circuit or combinational logic circuit, that is, for each sequential logic circuit or combinational logic circuit, it can occupy a rectangular area in the computing chip.

Taking the computing chip shown in FIGS. 1 to 5 as an example, the sequential logic circuit therein can include a register 300, the combinational logic circuit can include a first combinational logic circuit 100 and a second combinational logic circuit 200, and the first combinational logic circuit 100 can include an adder while the second combinational logic circuit 200 can include other conventional logic circuits except a circuit for performing an addition operation. The first combinatorial logic circuit 100 can occupy a plurality of first cell points adjacent to one another, the second combinatorial logic circuit 200 can occupy one or more second cell points, and the register 300 can occupy a plurality of third cell points. It should be noted that the first cell points, the second cell points, and the third cell points are intended to distinguish cell points belonging to different circuits or devices, but areas occupied by the first cell points, the second cell points, and the third cell points on the computing chip are equal.

In the computing chip, the register 300 can be used to store data output by a previous combinational logic circuit and transmit the stored data to a next combinational logic circuit for further processing at an appropriate moment under the control of a clock signal.

In some embodiments, the register 300 can be a multi-bit register, which can include a plurality of storage units and at least one clock unit, and each storage unit or clock unit can occupy a plurality of third cell points respectively and is arranged on a same column in the computing chip.

Further, to facilitate more flexible disposition of space in the computing chip, the register 300 can be composed of several sub-registers having less numbers of bits. In the example shown in FIGS. 1 to 5, the register 300 can include a low-bit sub-register 310 and a high-bit sub-register 320 having an equal fourth number of bits N0, so as to implement a balanced space arrangement. It can be understood that when the fourth number of bits of both the low-bit sub-register 310 and the high-bit sub-register 320 is N0, a third number of bits of the register 300 including the low-bit sub-register 310 and the high-bit sub-register 320 is 2*N0. In a specific example, N0 can be 4, 8, 16, 32, or the like.

The low-bit sub-register 310 can include N0 first storage units and one first clock unit, the high-bit sub-register 320 can include N0 second storage units and one second clock unit, and the first clock unit and the second clock unit can be connected to a same clock signal source together, so as to synchronize all clocks in the same register 300.

Further, in order to simplify the connection of the first clock unit and the second clock unit, the first clock unit and the second clock unit can be disposed on two middle rows of the computing chip, and the first storage unit and the second storage unit can be arranged toward both sides of the computing chip, respectively.

In the example shown in FIGS. 1 to 5, a maximum number of cell points that can be accommodated by each column in the computing chip, i.e. a first preset number N1, can be decided according to the number of rows occupied by the register 300, where N1=2*N0+2. Specifically, in one register 300, the plurality of first storage units can be respectively located on 1st to N0th rows from top to bottom (from low-bit to high-bit) in the computing chip, the first clock unit can be located on an (N0+1)th row, the second clock unit can be located on an (N0+2)th row, and the plurality of second storage units are respectively located on (N0+3)th to (2*N0+2)th rows.

For ease of description, the number of second cell points occupied by each second combinational logic circuit 200 described in this disclosure is less than or equal to the first preset number N1. However, it can be understood that the second combinational logic circuit 200 can also be defined in another manner such that the number of its occupied second cell points is greater than the first preset number N1. In this case, those skilled in the art can still adjust the layout of the second combinational logic circuit 200 or other circuits or devices in the computing chip according to the technical solution described in the present disclosure, so as to make full use of originally vacant cell points and make the computing chip more compact.

As shown in FIGS. 1 to 5, in a data flow direction in the computing chip, one or more second combinational logic circuits 200 can be continuously arranged. In some embodiments, an input of a leading second combinational logic circuit 200 can be directly connected to the register 300, and an output of a last second combinational logic circuit 200 can be directly connected to another register 300 different from the above register.

Of course, in some other embodiments, an input and/or output of at least one second combinational logic circuit can also be directly connected to the first combinational logic circuit. In a specific example, an input of a corresponding second combinational logic circuit can be directly connected to a first combinational logic circuit in a previous operation stage, or an output of a corresponding second combinational logic circuit can be directly connected to a first combinational logic circuit in a next operation stage.

According to different algorithms, operations performed by the second combinational logic circuit 200 can be diversified, and accordingly, the second cell points to be occupied by each second combinational logic circuit 200 may be different in number, and in some cases, the second cell points in the same second combinational logic circuit 200 can be distributed discontinuously. Therefore, the layout of the computing chip can be adjusted according to the second combinational logic circuit 200 in order to make full use of the space.

In some cases, similar to the register 300 described above, one second combinational logic circuit 200 can be composed of several second combinational logic sub-circuits having less numbers of bits. In the example shown in FIGS. 1 to 5, the second combinational logic circuit 200 can include a low-bit second combinational logic sub-circuit 210 and a high-bit second combinational logic sub-circuit 220. Since the second combinational logic circuit 200 does not include a clock unit, its second number of bits is generally less than or equal to 2*N0, and in an area on the computing chip for arranging the second combinational logic circuit 200, cell points located in the two middle rows of the computing chip can be left vacant. In particular, in some cases, at least one second combinational logic circuit 200 occupies a third preset number, N3, of the second cell points located in a same second complete column, wherein N3=N1−2.

As shown in FIGS. 1 to 5, in a data flow direction in the computing chip, a first combinational logic circuit 100 is further provided. In some embodiments, an input of the first combinatorial logic circuit 100 can be directly connected to the register 300, and an output of the first combinatorial logic circuit 100 can be directly connected to another register 300 different from the above register, to implement corresponding processing of the data. Related to the third number of bits, 2*N0, of the register 300, the first number of bits of the first combinatorial logic circuit 100 can be 2*N0 or 2*N0−1.

Of course, in some other embodiments, an input and/or output of the first combinational logic circuit can also be directly connected to the second combinational logic circuit, to implement the corresponding operation.

When the first combinational logic circuit 100 is an adder, a plurality of first cell points corresponding to the first combinational logic circuit 100 are usually adjacent to each other due to functional requirements. The above restrictions need to be taken into consideration when adjusting the layout of various circuits or devices in order to make full use of the space on the computing chip.

As shown in FIG. 1, in an ideal case, the first combinatorial logic circuit 100, the second combinatorial logic circuit 200, and the register 300 respectively occupy completely or substantially completely all of the cell points in respective rectangular areas. Of course, in the second combinational logic circuit 200, there may be one or two vacant rows between the low-bit second combinational logic sub-circuit 210 and the high-bit second combinational logic sub-circuit 220, but this will not greatly affect the overall space utilization of the computing chip.

In some cases, if the second cell points to be occupied by one second combinational logic circuit is few in number, the second combinational logic circuit can be disposed in the one or two middle rows originally left vacant, such that the second combinational logic circuit no longer needs to occupy a separate column in the computing chip, thereby helping to reduce the total number of columns of cell points and further the required area of the computing chip.

Figure 2:
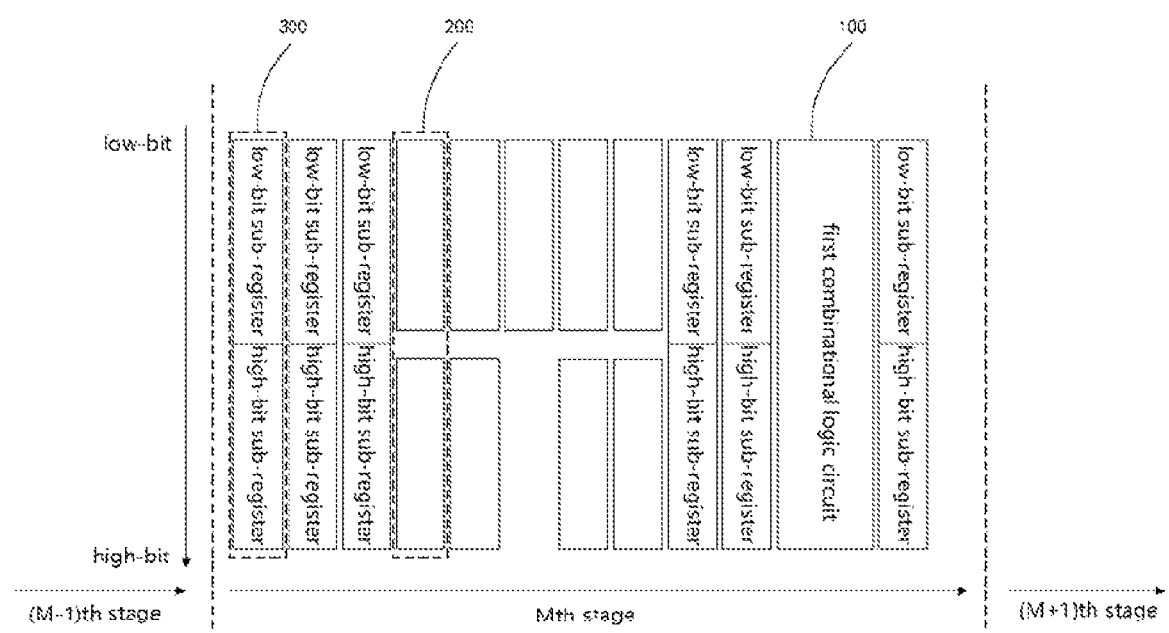
FIG. 2 is a schematic structural diagram of another computing chip.

As shown in FIG. 2, in some cases, if the number of second cell points to be occupied by one second combinational logic circuit 200 is less than or equal to a second preset number N2 (N2=N1/2), and the one or two middle rows of the cell points in the computing chip, which are originally left vacant, are inadequate to arrange this second combinational logic circuit 200, the second combinational logic circuit will occupy a new column of cell points, resulting in a waste of space in the computing chip. In the specific example of FIG. 2, a middle second combinational logic circuit 200 occupies only half or less than half of cell points in one column.

Figure 3:
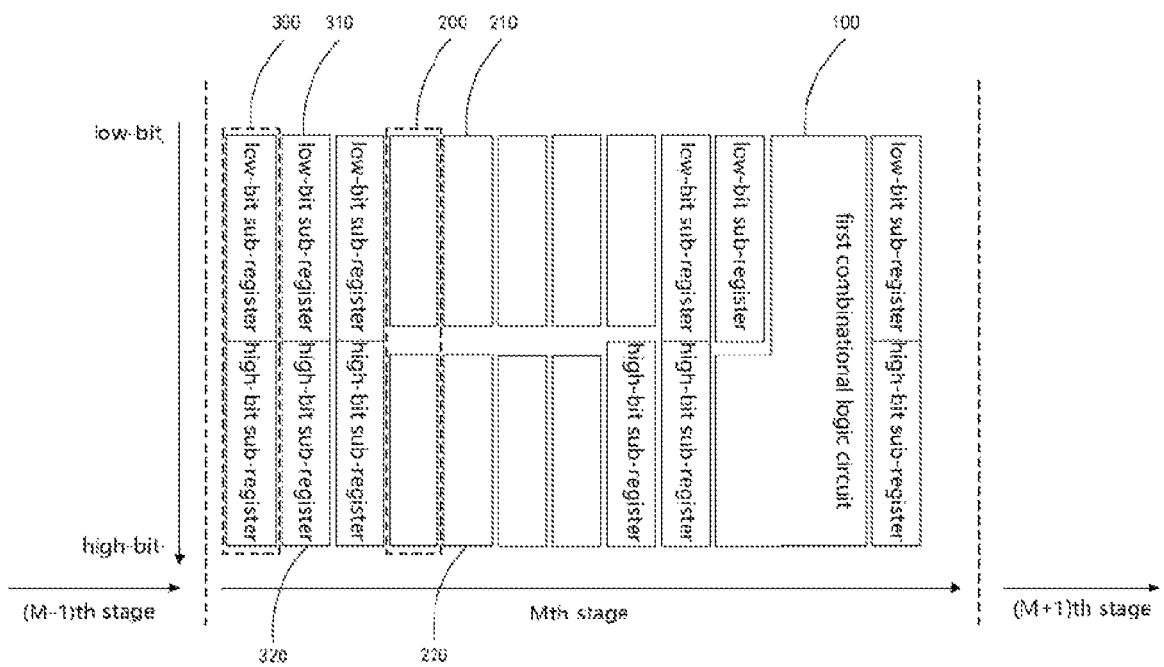
FIG. 3 is a schematic structural diagram of a computing chip according to an exemplary embodiment of the present disclosure.

In this case, as shown in FIG. 3, the second combinational logic sub-units and/or sub-registers to the right of the originally vacant cell points can be shifted one by one to the left, and when shifting to the first combinational logic circuit 100, a portion of the first cell points in the first combinational logic circuit 100 can be arranged to share a same column with the second combinational logic sub-units or sub-registers, thereby making full use of the space in the computing chip. In other words, in the first combinational logic circuit 100, at least a portion of the first cell points are located in a first incomplete column in which the number of first cell points is less than the first preset number N1; meanwhile, in the second combinational logic circuit 200, at least a portion of the second cell points are located in a second incomplete column in which the number of second cell points is less than or equal to the second preset number N2; and in the register 300, at least a portion of the third cell points are located in the first incomplete column or the second incomplete column, i.e., at least two of the first combinational logic circuit 100, the second combinational logic circuit 200, and the register 300 can share cell points on a same column in the computing chip.

In some embodiments, the first cell points occupied by the first combinational logic circuit 100 are great in number, thus at least another portion of the first cell points are located in a first complete column in which the number of first cell points is equal to the first preset number N1. At this time, the first combinational logic circuit 100 including both the first complete column and the first incomplete column will occupy an L-shaped area.

Since a rearrangement with respect to the second combinational logic circuit 200 and the register 300 is performed in units of the second combinational logic sub-circuit or sub-register, and the numbers of bits of each second combinational logic sub-circuit or sub-register are generally half of the numbers of bits of the second combinational logic circuit 200 and the register 300, respectively (in some cases, the number of bits of the second combinational logic sub-circuit is less than half of the number of bits of the second combinational logic circuit 200), the number of possibly vacant cell points in one column is generally greater than or equal to N2, and accordingly, in the first incomplete column, the number of first cell points can be greater than or equal to the second preset number N2.

Further, in order to reduce the number of cell points in the computing chip as far as possible, the number of first incomplete columns in a same first combinational logic circuit 100 can be equal to one, so as to avoid an increased total number of columns of cell points in the computing chip caused by too many first incomplete columns.

Figure 4:
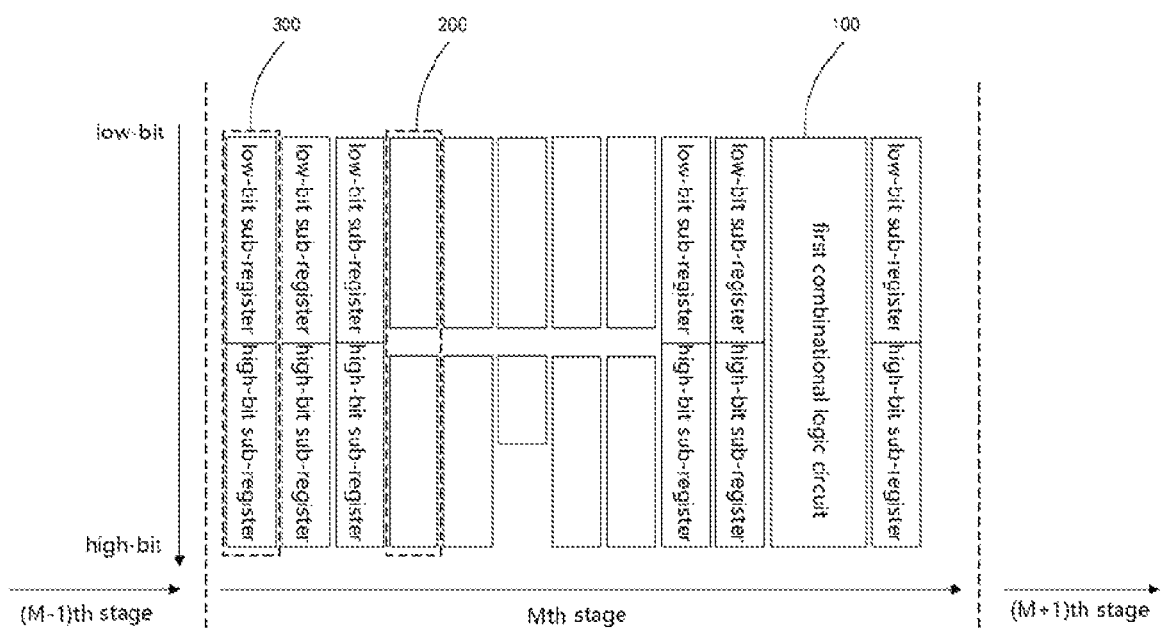
FIG. 4 is a schematic structural diagram of a still other computing chip.

In other cases, as shown in FIG. 4, the number of second cell points occupied by a same second combinational logic circuit 200 may be greater than the second preset number N2, i.e., the second combinational logic circuit occupies more than half of cell points in a same column.

Figure 5:
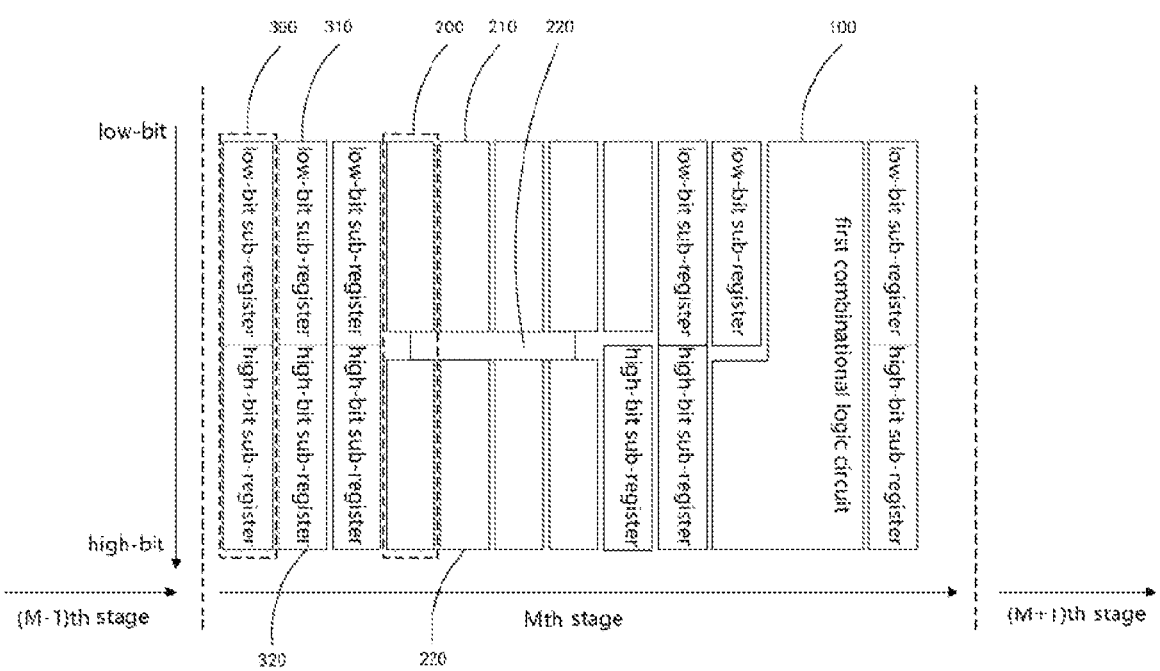
FIG. 5 is a schematic structural diagram of a computing chip according to another exemplary embodiment of the present disclosure.

In this case, as shown in FIG. 5, one or more second cell points whose count is more than the second preset number N2 can be arranged on one or two middle rows of the computing chip, so as to vacate at least half of cell points in one column, thereby facilitating shifting the second combinational logic sub-circuits and/or sub-registers that are originally on the right to the left one by one, without splitting the second combinational logic sub-circuits and/or sub-registers again, thereby helping to guarantee the integrity of the circuit or the device. When shifting to the first combinational logic circuit 100, a portion of the first cell points in the first combinational logic circuit 100 can be arranged to share a same column with the second combinational logic sub-units or sub-registers, thereby making full use of the space in the computing chip.

In the solution of the present disclosure, with the use of the incompleteness of the numbers of bits of the second combinational logic circuit 200, by changing the layout of the cell points occupied by the first combinational logic circuit 100, the second combinational logic circuit 200 and/or the register 300, specifically, it is not limited to allocate a respective rectangular area to each of the first combinational logic circuit 100, the second combinational logic circuit 200, or the register 300, but at least two types of cell points, which belong to different circuits or devices, in the first cell points, the second cell points, and the third cell points, are arranged in a same column of the computing chip, which realizes full use of the area in the computing chip and improves the overall utilization.

According to a second aspect of the present disclosure, there is further provided a hashrate board, in which the computing chip as described above can be included. Specifically, the hashrate board can include one or more computing chips. Multiple computing chips can perform computing tasks in parallel.

According to a third aspect of the present disclosure, there is further provided a data processing apparatus, in which the hashrate board as described above can be included. Specifically, the data processing apparatus can include one or more hashrate boards. Multiple hashrate boards can perform computing tasks in parallel, such as executing a SHA-256 algorithm.

As used herein, terms "front", "back", "top", "bottom", "above", "below", and the like, if any, are used for descriptive purposes and not necessarily for describing permanent relative positions. It should be understood that such terms are interchangeable where appropriate such that the embodiments of the present disclosure described herein can, for example, perform operations in other orientations different from those shown or otherwise described herein.

As used herein, the term "exemplary" means "serving as an example, instance, or illustration", and not as a "model" that is to be duplicated accurately. Any implementation exemplarily described herein is not necessarily to be construed as preferred or advantageous over other implementations. Furthermore, the present disclosure is not limited by any expressed or implied theory presented in the above technical field, background, summary or detailed description.

As used herein, the term "substantially" means encompassing any minor variations resulting from design or fabrication imperfections, apparatus or component tolerances, environmental influences and/or other factors. The term "substantially" also allows for differences from a perfect or ideal situation due to parasitic, noise, and other practical considerations that may exist in a practical implementation.

In addition, the foregoing description may mention elements or nodes or features being "connected" or "coupled" together. As used herein, unless expressly stated otherwise, "connected" means that one element/node/feature is electrically, mechanically, logically, or otherwise connected (or in communication) with another element/node/feature. Similarly, unless expressly stated otherwise, "coupled" means that one element/node/feature can be mechanically, electrically, logically or otherwise connected to another element/node/feature in a direct or indirect manner to allow interaction, even though the two features may not be directly connected. That is, "coupled" is intended to encompass both direct and indirect connections of elements or other features, including a connection by using one or more intermediate elements.

In addition, for reference purposes only, similar terms such as "first", "second", can also be used herein, and thus are not intended to be limiting. For example, the terms "first", "second", and other such numerical terms referring to structures or elements do not imply a sequence or order unless explicitly indicated by the context.

It should also be noted that terms "comprising", "including", "having", and any other variations thereof, as used herein, specify the presence of stated features, unity, steps, operations, elements, and/or components, but do not preclude the presence or addition of one or more other features, unity, steps, operations, elements, components, and/or combinations thereof.

In the present disclosure, the term "providing" is used broadly to encompass all ways of obtaining an object, and thus "providing an object" includes, but is not limited to, "purchasing", "preparing/manufacturing", "arranging/disposing", "installing/assembling", and/or "ordering" the object, and the like.

Those skilled in the art should also appreciate that boundaries between the above operations are merely illustrative. Multiple operations can be combined into a single operation, the single operations can be distributed in a plurality of additional operations, and the operations can be performed in at least partially overlapping manner in time. Moreover, alternative embodiments can include multiple instances of a specific operation, and the order of operations can be altered in various other embodiments. However, other modifications, variations, and alternatives are also possible. Accordingly, the specification and drawings should be regarded as illustrative rather than restrictive.

Although some specific embodiments of the present disclosure have been described in detail by way of examples, it should be understood by those skilled in the art that the above examples are for illustration only and are not intended to limit the scope of the present disclosure. The embodiments disclosed herein can be arbitrarily combined with each other without departing from the spirit and scope of the present disclosure. Those skilled in the art should also appreciate that modifications can be made to the above embodiments without departing from the scope and spirit of the present disclosure. The scope of the present disclosure is defined by the attached claims.

What is claimed is:

1. A computing chip comprising a plurality of operation stages arranged in a pipeline configuration, each operation stage comprising:

a first combinational logic circuit occupying a plurality of first cell points adjacent to each other, at least a portion of the first cell points being located in a first incomplete column in which the number of first cell points is less than a first preset number N1, such that the first combinational logic circuit occupies a non-rectangular area in the computing chip, wherein the first preset number N1 is a maximum number of cell points that can be accommodated by each column in the computing chip;

one or more second combinational logic circuits each occupying one or more second cell points, at least a portion of the second cell points being located in a second incomplete column in which the number of second cell points is less than or equal to a second preset number N2, wherein N2=N1/2; and a plurality of registers each occupying a plurality of third cell points, at least a portion of the third cell points being located in the first incomplete column or the second incomplete column;

wherein the first cell points, the second cell points, and the third cell points occupy equal areas on the computing chip.

2. The computing chip according to claim 1, wherein at least another portion of the first cell points are located in a first complete column in which the number of first cell points is equal to the first preset number N1.

3. The computing chip according to claim 1, wherein in the first incomplete column, the number of first cell points is greater than or equal to the second preset number N2.

4. The computing chip according to claim 1, wherein in the first combinational logic circuit of each of the plurality of operation stages, the number of first incomplete columns is equal to one.

5. The computing chip according to claim 1, wherein in a data flow direction in the computing chip, an input of the first combinational logic circuit is directly connected to a register, or an output of the first combinational logic circuit is directly connected to a register.

6. The computing chip according to claim 1, wherein in a data flow direction in the computing chip, an input of the first combinational logic circuit is directly connected to the second combinational logic circuit, or an output of the first combinational logic circuit is directly connected to the second combinational logic circuit.

7. The computing chip according to claim 1, wherein the first combinational logic circuit comprises an adder.

8. The computing chip according to claim 1, wherein when the number of second cell points occupied by a same second combinational logic circuit is greater than the second preset number N2, one or more second cell points whose count is more than the second preset number N2 are located on one or two middle rows of the computing chip.

9. The computing chip according to claim 1, wherein at least one second combinational logic circuit occupies a third preset number, N3, of second cell points located in a same second complete column, wherein N3=N1−2.

10. The computing chip according to claim 1, wherein in a data flow direction in the computing chip, an input of a leading second combinational logic circuit is directly connected to a register, and an output of a last second combinational logic circuit is directly connected to a register.

11. The computing chip according to claim 1, wherein in a data flow direction in the computing chip, an input of at least one second combinational logic circuit is directly connected to the first combinational logic circuit, or an output of at least one second combinational logic circuit is directly connected to the first combinational logic circuit.

12. The computing chip according to claim 1, wherein each register comprises a low-bit sub-register and a high-bit sub-register having an equal fourth number of bits N0, wherein N0=(N1−2)/2.

13. The computing chip according to claim 12, wherein the low-bit sub-register comprises N0 first storage units and one first clock unit;
    the high-bit sub-register comprises N0 second storage units and one second clock unit;
    wherein the first clock unit and the second clock unit are connected to a same clock signal source together.

14. The computing chip according to claim 13, wherein the first clock unit and the second clock unit are located on two middle rows of the computing chip.

15. The computing chip according to claim 12, wherein a first number of bits of the first combinational logic circuit is 2*N0 or 2*N0−1;
    a second number of bit of the second combinational logic circuit is less than or equal to 2*N0; and
    a third number of bit of a register is 2*N0.

16. A hashrate board, comprising one or more computing chips according to claim 1.

17. A data processing apparatus, comprising one or more hashrate boards according to claim 16.

* * * * *